(12) United States Patent
Heo

(10) Patent No.: US 7,525,645 B2
(45) Date of Patent: Apr. 28, 2009

(54) EXPOSURE APPARATUS AND METHOD, AND MASK STAGE THEREFOR

(75) Inventor: Sung-Soo Heo, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 289 days.

(21) Appl. No.: 11/426,886

(22) Filed: Jun. 27, 2006

(65) Prior Publication Data
US 2007/0002785 A1    Jan. 4, 2007

(30) Foreign Application Priority Data
Jun. 29, 2005    (KR) ...................... 10-2005-0057244
Apr. 14, 2006    (KR) ...................... 10-2006-0033868

(51) Int. Cl.
G03B 27/62    (2006.01)
G03B 27/42    (2006.01)

(52) U.S. Cl. .......................... 355/76; 355/53

(58) Field of Classification Search .................. 355/53, 355/76, 77; 430/5, 20, 30
See application file for complete search history.

(56) References Cited

U.S. PATENT DOCUMENTS

| | | | |
|---|---|---|---|
| 5,434,424 A | 7/1995 | Stickel et al. | |
| 5,731,591 A | * 3/1998 | Yamada et al. | ........... 250/492.2 |
| 6,628,372 B2 | 9/2003 | McCullough et al. | |
| 6,888,615 B2 | 5/2005 | Tsacoyeanes et al. | |

FOREIGN PATENT DOCUMENTS

| | | | |
|---|---|---|---|
| JP | 08-097136 | | 4/1996 |
| JP | 2000-075497 | | 3/2000 |
| JP | 2000075497 A | * | 3/2000 |
| JP | 2001-76998 | | 3/2001 |
| JP | 2002-252171 | | 9/2002 |
| KR | 2002-0067425 | | 8/2002 |
| KR | 10-2004-0049497 | | 6/2004 |
| KR | 10-2006-0007211 | | 1/2006 |

OTHER PUBLICATIONS

Machine translation of detailed description of JP2000-075497 is attached to this office action.*
English language abstract of Korean Publication No. 2002-0067425.
English language abstract of Japanese Publication No. 08-097136.
English language abstract of Japanese Publication No. 2000-075497.
English language abstract of Japanese Publication No. 2002-252171.

* cited by examiner

*Primary Examiner*—Hung Henry Nguyen
*Assistant Examiner*—Mesfin T Asfaw
(74) *Attorney, Agent, or Firm*—Marger Johnson & McCollom, P.C.

(57) ABSTRACT

In an embodiment a mask stage is used for an exposure process. The mask stage includes a first module. The first module includes a plurality of support surfaces on which a plurality of masks are mounted. The first module has a substantially cylindrical shape having a cavity. The support surfaces are provided on an inner surface of the first module. Replacement of a mask is performed by rotating the first module around a central axis of the first module. A magnetic force may be used to rotate the first module.

25 Claims, 9 Drawing Sheets

EXPOSURE APPARATUS AND METHOD, AND MASK STAGE THEREFOR

CROSS-REFERENCE TO RELATED PATENT APPLICATIONS

This U.S. non-provisional patent application claims priority under 35 U.S.C. § 119 from Korean Patent Applications 2005-57244 and 2006-33868, filed on Jun. 29, 2005 and Apr. 14, 2006, respectively, the contents of which are hereby incorporated herein by reference in their entirety.

BACKGROUND

1. Field of the Invention

The present invention relates to an apparatus and method for manufacturing a substrate, and more particularly, to an exposure apparatus and method for transferring a pattern formed in a mask onto a substrate, and a mask stage used for the exposure apparatus and method.

2. Description of the Related Art

Generally, a plurality of processes, such as an ion implantation process, a deposition process, a diffusion process, a photolithography process, and an etching process are required to manufacture a semiconductor device. The photolithography process is used for forming a desired pattern on a wafer. The photolithography process typically includes a coating process for coating a photoresist on a wafer, an exposure process for illuminating light to transfer a pattern formed in a mask onto the photoresist, and a developing process for removing the photoresist from a predetermined region on the wafer after the exposure process.

An apparatus for performing the exposure process may include: a mask stage on which a mask is placed, a light source for illuminating light onto the mask, a wafer stage on which a wafer is placed, and a projection lens located between the mask stage and the wafer stage to project light that has passed through the mask onto the wafer. A plurality of masks having different patterns are used when the exposure process is performed on one of several wafers belonging to different groups, wafers belonging to the same group, or a single wafer. A generally used mask stage has a limited structure where the mask stage mounts only a single mask thereon. Therefore, when a mask in which a different pattern is formed is to be used during a process, a mask that has already been mounted on the mask stage should be replaced. To replace a mask, the mask that has been used is unloaded from the mask stage, and a new mask is drawn out from a mask storage place such as a library and a SMIF pod, and then a position of the drawn-out new mask is aligned and loaded onto the mask stage. Movement of a mask is performed slowly so that the mask may be mounted on the mask stage with its position aligned. Therefore, it takes a relatively long time to replace the mask.

SUMMARY

Embodiments provide an exposure apparatus, a method, and a mask stage, capable of efficiently performing an exposure process, and capable of reducing a time taken for replacing a mask.

Embodiments provide an exposure apparatus including: a substrate stage on which a substrate is put; a mask stage on which masks in which different patterns are formed are mounted; a light source member for illuminating light onto the mask that is positioned on a process position; and a projection lens for projecting light that has passed through the mask onto the substrate, wherein the mask stage includes: a first module having a plurality of support surfaces, on each of which an individual mask is seated; and a mask replacing unit for changing a position of the first module so that a mask to be used for a process among the masks seated on the support surfaces is moved to the process position.

In one embodiment, the first module may have a cylindrical shape including an inside where a space is formed, and the support surfaces may be provided on a lateral surface of the first module. The mask replacing unit may include a rotation unit rotating the first module.

The support surfaces may be arranged on an inner lateral surface of the first module to surround a central axis of the first module, and first openings passing through the first module may be formed in the support surfaces in order to provide a passage through which a pattern of the mask is transferred to the substrate.

In one embodiment, the mask stage may further include a mask moving unit for moving the first module in a straight line during a process. The mask moving unit may include: a second module having a cylindrical-shaped body that includes a space for receiving the first module and has a second opening providing a passage through which a pattern of a mask moved to the process position is transferred to the substrate; a support module for supporting the second module; a second module driver for providing driving force to move the second module in a straight line along the support module; and a first module driver for simultaneously moving the first module with the second module, and changing a position of the first module relative to the second module to correct a position of the first module.

In one embodiment, the second module driver may include: a first moving magnetic member fixedly installed in the second module; a second moving magnetic member fixedly installed in the support module; and a first controller for controlling a current applied to at least one of the first moving magnetic member and the second magnetic member such that the second module moves in a straight line with respect to the support module using magnetic force between the first moving magnetic member and the second moving magnetic member. A gas supply hole for supplying a gas floating the second module with respect to the support module may be formed in one of the support module and the second module.

In one embodiment, the first module driver comprises: a movement detecting sensor for detecting movement of the first module; first correction magnetic members located between the first openings and fixedly installed in the first module; second correction magnetic members fixedly installed in the second module to face the first correction magnetic members respectively located on both sides of the mask positioned on the process position; and a second controller for receiving a signal detected by the movement detecting sensor, and controlling a current applied to at least one of the first correction magnetic member and the second correction magnetic member such that the first module moves with the second module by magnetic force between the first correction magnetic member and the second correction magnetic member, and a position of the first module relative to the second module changes. A gas supply hole for supplying a gas floating the first module with respect to the second module may be formed in one of the first module and the second module.

In one embodiment, the rotation unit may include a first rotation magnetic member fixedly installed in the first module and a second rotation magnetic member fixedly installed in the second module; and the exposure apparatus may further include a third controller for controlling a current applied to at least one of the first rotation magnetic member and the second rotation magnetic member such that the first module rotates using magnetic force between the first rotation magnetic member and the second rotation magnetic member.

The mask stage may include a rotation sensing member for sensing a rotation position of the first module. In one embodiment, the rotation sensing member may include: a scale part disposed in a ring shape on one of the first module and the second module; and a sensor part fixedly installed on the other of the first module and the second module and sensing the scale of the scale part.

In one embodiment, the substrate stage may be located such that a substrate is fixed in its upright state during a process, and the substrate stage, the projection lens and the mask stage may be arranged side by side in a lateral direction.

In one embodiment, the present invention provides a substrate stage used during an exposure process.

The mask stage may include: a first module having a plurality of support surfaces, on each of which an individual mask is put in order to simultaneously support masks in which different patterns are formed; and a mask replacing unit for moving the first module in a straight line or rotating the first module so that a mask to be used for a process among the masks supported by the support surfaces is moved to the process position.

In one embodiment, the present invention provides a method of performing an exposure process, the method including: illuminating light onto a mask located on a process position; and transferring a pattern formed in the mask onto a substrate, wherein replacing of mask is performed by mounting a plurality of masks on a mask stage and changing a position of the mask stage.

In one embodiment, the masks may be arranged to be fixed along the lateral surface of the first module provided in the cylindrical shape, and a position of the mask stage is changed by rotation of the first module.

In one embodiment, an exposure process may be performed using scanning by moving the mask in a straight line, and the moving of the mask in the straight line may be performed by magnetic force.

In one embodiment, the first module may be located in a space inside a cylindrical-shaped second module, the second module may be moved in a straight line along a support module by magnetic force, the first module may be moved with the second module by magnetic force, and a position of the first module relative to the second module may change while the first module and the second module move simultaneously, so that a position of the first module is corrected.

In one embodiment, the second module may be floated from the support module by a gas during a process, and the first module may be floated from the second module by a gas during a process.

BRIEF DESCRIPTION OF THE DRAWINGS

The accompanying drawings, which are included to provide a further understanding of the invention, and are incorporated in and constitute a part of this application, illustrate embodiments, and together with the description serve to explain the principle of the invention. In the drawings.

DETAILED DESCRIPTION

Figure 1:
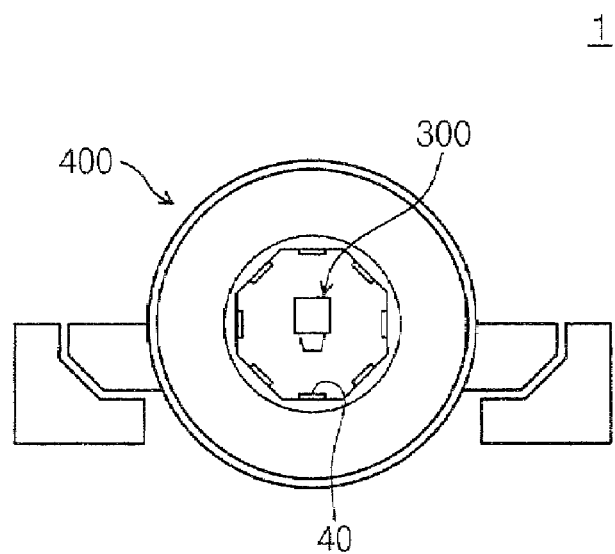
FIG. 1 is a schematic front view illustrating an embodiment of an exposure apparatus.
Figure 1:
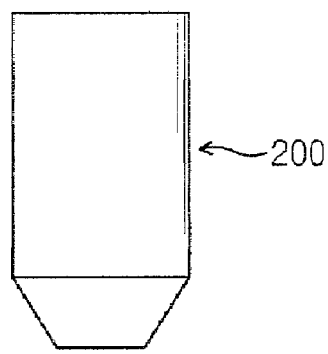
Figure 1:
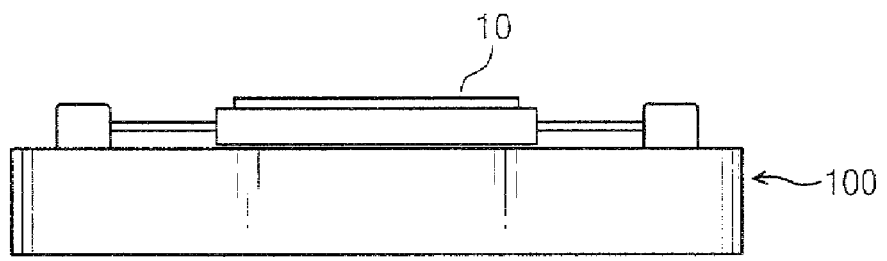

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the shape of an element is exaggerated for clarity.

FIG. 1 is a schematic front view illustrating an embodiment of an exposure apparatus 1. The exposure apparatus 1 includes a substrate stage 100, a projection lens 200, a light source member 300, and a mask stage 400. The substrate stage 100 supports a substrate 10 on which a process is performed. A wafer, which may be used for semiconductor chip manufacturing, is used for the substrate 10. The substrate 10 may be a substrate used for flat display panel manufacturing. The mask stage 400 is able to hold a plurality of masks 40, such as reticles, and may be located over the substrate stage 100. Masks 40 mounted on the mask stage 400 may have different patterns. The light source member 300 illuminates light onto one of the masks 40, and the projection lens 200 projects light that has passed through the mask 40 onto the wafer (substrate) 10. Though not shown in detail, the light source member 300 may include an exposure light source, a lighting optical system, and mirrors arranged so that light emitted from the exposure light source is incident to the lighting optical system. Since various structures of the light source member 300 and the projection lens 200 are well known in the art, detailed description thereof will be omitted.

Figure 2:
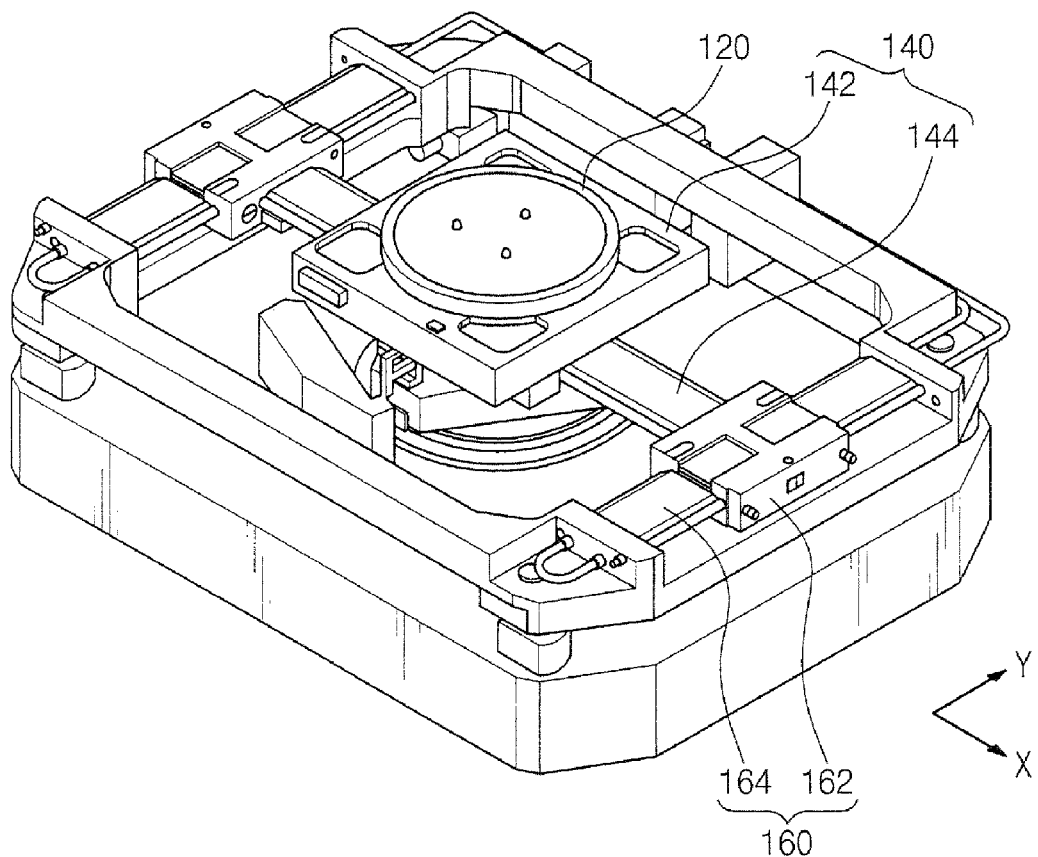
FIG. 2 is a perspective view of an embodiment of the substrate stage of FIG. 1.

FIG. 2 is a perspective view of the substrate stage 100. The substrate stage 100 may include a support plate 120, a first driving member 140, and a second driving member 160. The wafer 10 may be placed on the support plate 120. The first driving member 140 moves the support plate 120 in a first direction, and the second driving member 160 moves the support plate 120 in a second direction. The first direction may be perpendicular to the second direction. The first direction is called an X-axis direction, and the second direction is called a Y-axis direction hereinafter. The first moving member 140 includes a moving plate 142 fixedly coupled to the support plate 120, and a first guide rail 144 for guiding movement of the support plate 120 in an X-axis direction. The first guide rail 144 is disposed with a long dimension in the X-axis direction, and the moving plate 142 is moved in the X-axis direction along the first guide rail 144 by a first driver (not shown). The second driving member 160 includes brackets 162 fixedly coupled to both sides of the first guide rail 144, and second guide rails 164 for guiding movement of the brackets 162 in the Y-axis direction. The second guide rails 164 may include two rails that are spaced a predetermined distance from each other and disposed with their long dimension in the Y-axis direction. The first guide rail 144 is moved in the Y-axis direction along the second guide rails 164 by a second driver (not shown).

Figure 3:
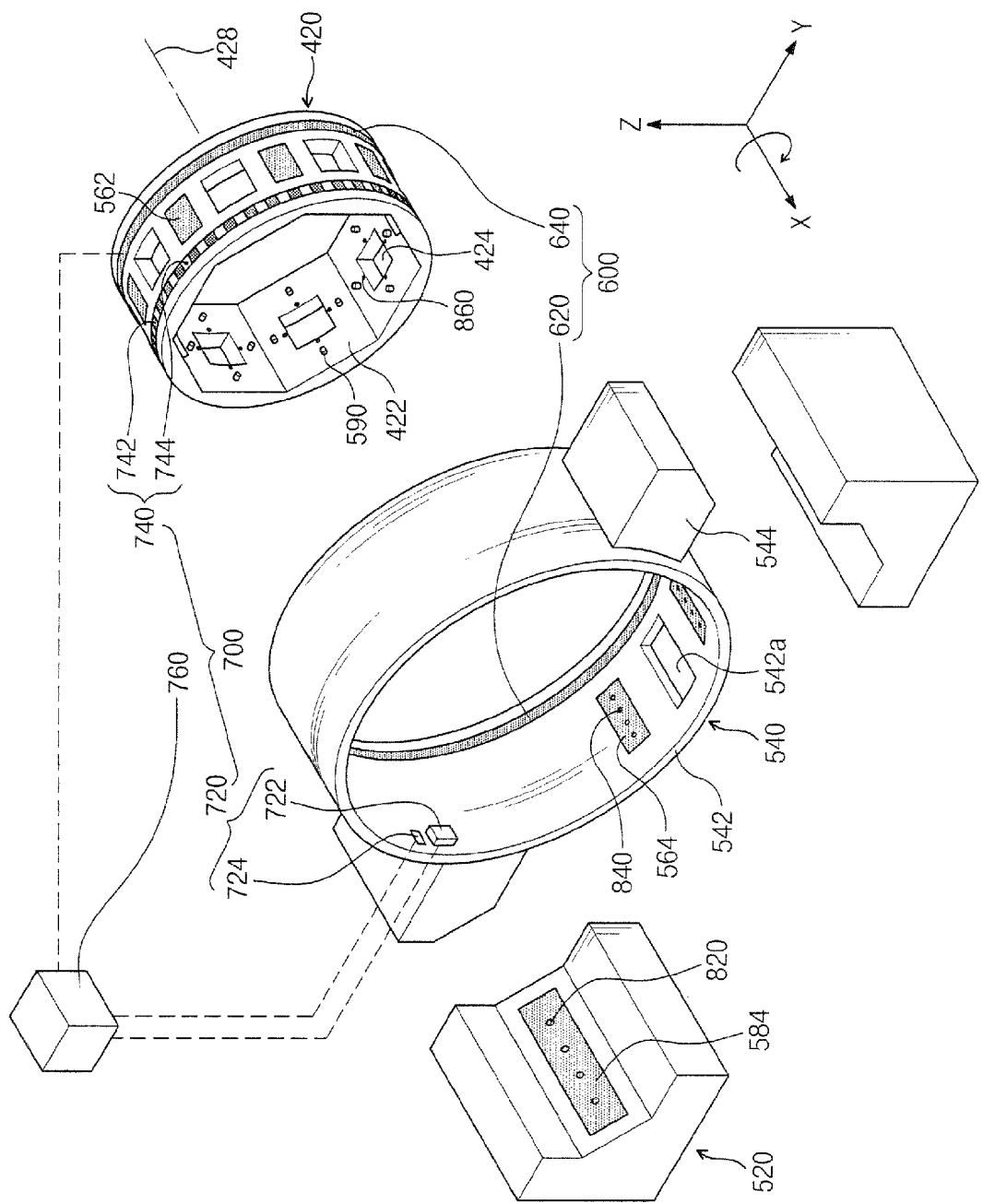
FIG. 3 is an exploded perspective view of the mask stage of FIG. 1.
Figure 4:
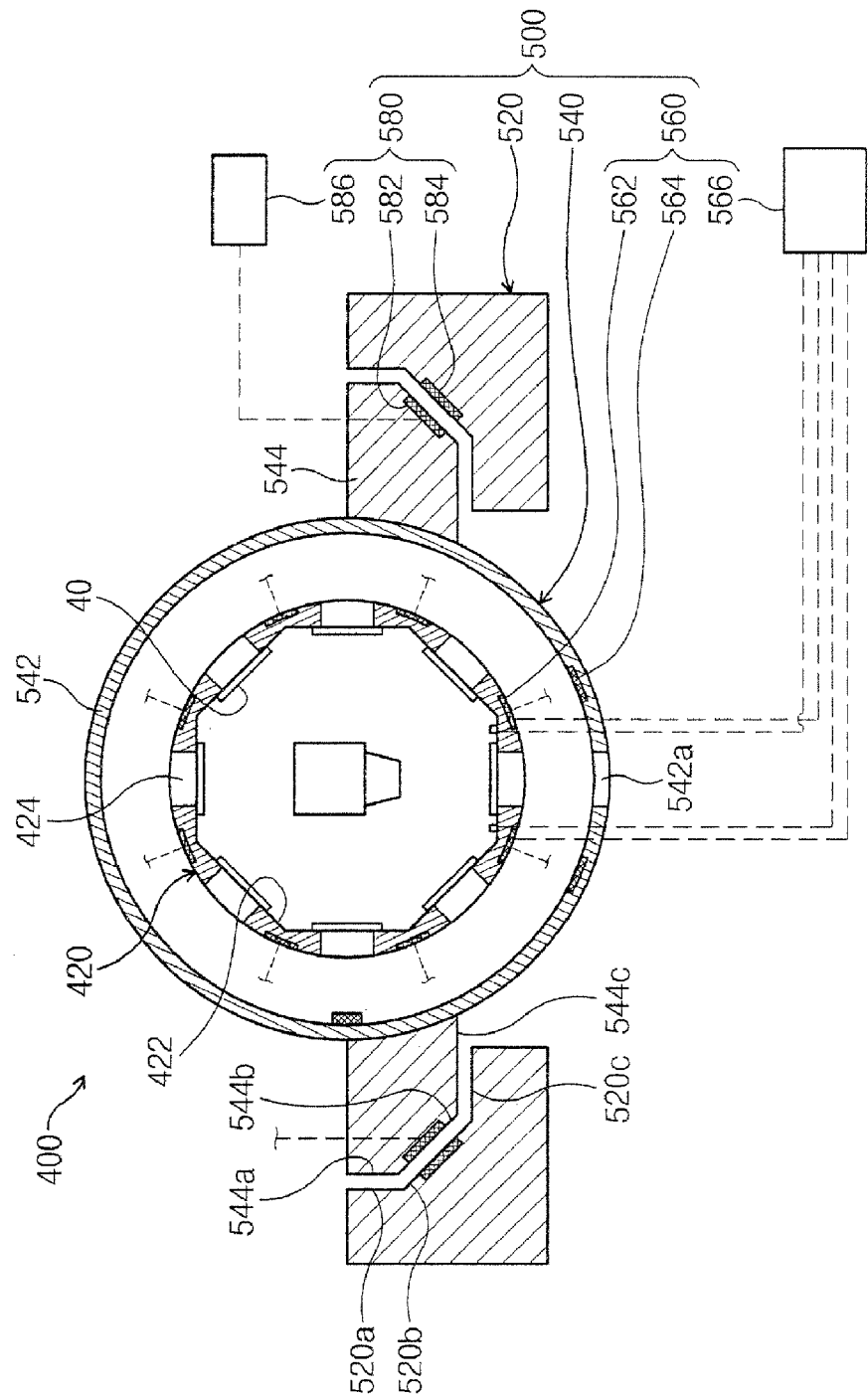
FIG. 4 is a cross-sectional view of an assembled mask stage of FIG. 1.
Figure 5:
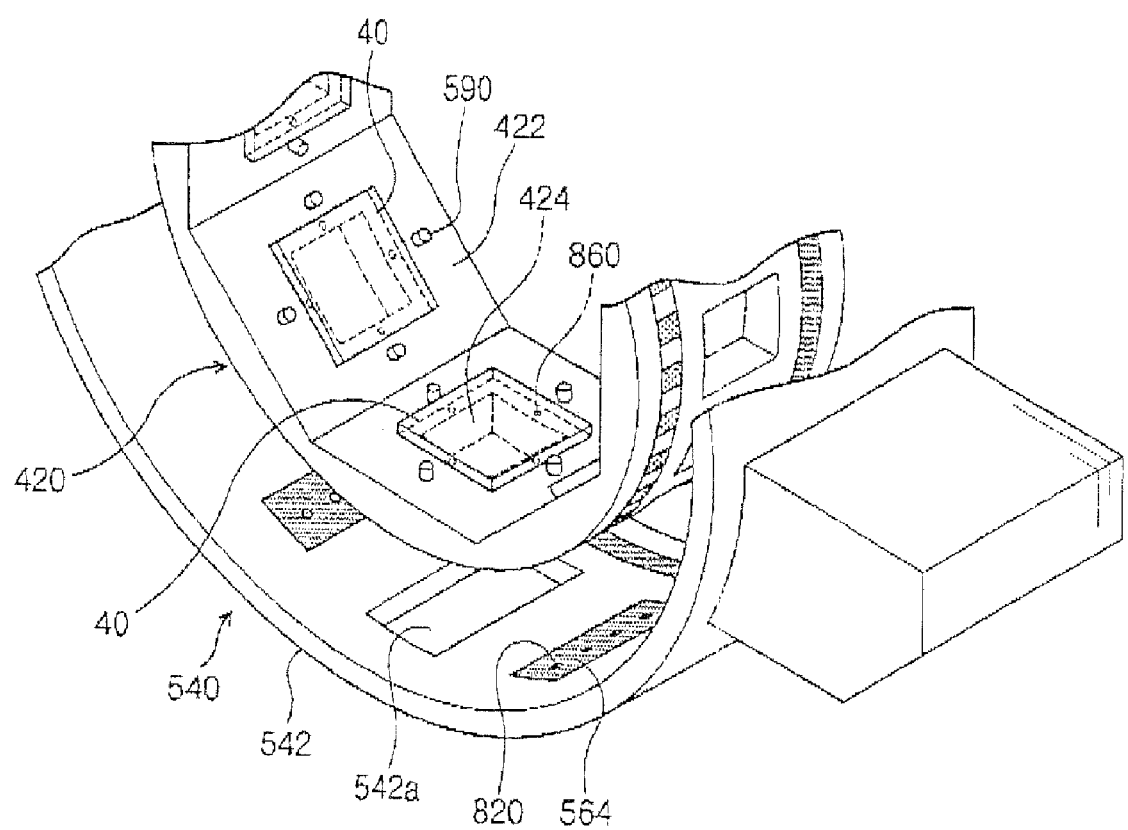
FIG. 5 is a view illustrating an embodiment where a mask is mounted on a mask stage.

FIG. 3 is an exploded perspective view of the mask stage 400 of FIG. 1. FIG. 4 is a cross-sectional view of the assembled mask stage of FIG. 1. FIG. 5 is an enlarged view illustrating masks 40 that are mounted on the mask stage 400.

Referring to these figures, the mask stage 400 may have a cylindrical shape. Preferably, the mask stage 400 includes a first module 420 on which a plurality of the masks 40 are mounted. The first module may include a substantially cylindrical shape having a cavity. The first module 420 is disposed so that a central axis 428 of the first module 420 is parallel to an X-axis (not necessarily the X-axis mentioned earlier). An inner surface of the first module 420 may include a plurality of support surfaces 422 for supporting the masks 40. Each of the support surfaces 422 may be a substantially rectangular plane, each having the same shape and size. The support surfaces 422 may be arranged to surround the central axis 428 of the first module 420. Therefore, in a cross-section of the first module 420 perpendicular to the central axis 428, the inner side of the first module 420 may have a shape of a regular polygon.

A first opening 424 formed in a radial direction of the first module 420 to pass through to an outer side of the first module 420 may be provided in each of the support surfaces 422. The first opening 424 may be provided as a passage through which a pattern of one of the masks 40 is transferred to the wafer 10 when light is illuminated onto one of the masks 40. Each first opening 424 may have the same rectangular shape.

Vacuum holes 860 may be formed in surrounding area of each first opening 424 so that one of the masks 40 may be fixed on one of the support surfaces 422 of the first module 420 by a vacuum.

Though the first module 420 has the cylindrical shape of the embodiment shown in FIG. 1, the first module 420 may be provided in a polyprism shape having a cavity such as a triangular or rectangular prism. Also, though the support surfaces 422 are provided on the inner surface of the first module 420 in FIG. 1, the support surfaces 422 may be provided on an outer surface of the first module 420. Though the first module 420 has eight support surfaces 422, the number of the support surfaces 422 may change.

The mask replacing unit moves one of the masks 40 that is to be used for a process to a process position. In the present embodiment, the process position is a position of one of the masks 40 on the first module 420 that can be provided substantially in parallel to the wafer 10 between the light source member 300 located within the cavity of the first module 420 and the wafer 10 disposed on the substrate stage 100. The mask replacing unit allows the mask to be used for the process to be moved to the process position by rotating the first module 420 around the central axis 428 of the first module 420. The mask replacing unit may be a rotation unit 600 whose detailed structure will be described later.

In one embodiment, an exposure process is performed by scanning. The wafer 10 is partitioned into a plurality of substantially rectangular regions. When the exposure process is performed on each region, the wafer 10 and the mask are successively moved with respect to each other so that a pattern of the mask may be transferred onto each region. When exposure is completed for one region, the substrate stage 100 may be moved a predetermined distance, and then the exposure is performed on the next region in the above-described manner.

The mask stage 400 may be moved in a straight line by a mask moving unit 500. The mask moving unit 500 includes a supporting module 520, a second module 540, a first module driver 560, and a second module driver 580.

The second module 540 may have a cylindrical shape. Preferably the second module 540 has a body 542 of a substantially cylindrical shape having a cavity. The second module 540 may be disposed so that a central axis 428 is parallel to the previously mentioned X-axis. The first module 420 is located within the cavity of the second module 540. The second module 540 may be disposed so that the central axis 428 of the second module 540 substantially coincides with the central axis 428 of the first module 420. A second opening 542a, which may be a passage through which a pattern formed in one of the masks 40 is transferred, is formed in the second module 540. The second opening 542a may be formed in a position vertically facing the first opening 424 formed in one of the support surfaces 422 that supports the mask that has been moved to the process position. The second module 540 includes a side plate 544 fixedly coupled to an outer surface of the body 542. The side plate 544 may be projected toward the outside from both sides of the body 542 of the second module 540 along a lengthwise direction of the body 542 of the second module 540. The side plate 544 may include a vertical plane 544a, an inclined plane 544b, and a horizontal plane 544c. The support module 520 guides a straight line movement of the second module 540. The support module 520 may include a vertical plane 520a, an inclined plane 520b, and a horizontal plane 520c formed to face the vertical plane 544a, the inclined plane 544b, and the horizontal plane 544c of the second module 540, respectively.

The second module 540 may be moved while it does not contact the support module 520 during a process. A gas supply hole 820 for supplying a gas toward the second module 540 may be formed in the inclined plain 520b of the support module 520 to float the second module 540 from the support module 520. The gas may include air, a nitrogen gas, and an inert gas. The gas supply hole 820 may be formed in a slit shape or provided as a plurality of circular holes. The gas supply hole 820 may be provided to a second movement magnetic member 584. Though the gas supply hole 820 may be formed in the support module 520 in the above description, the gas supply hole 820 may be also formed in the side plate 544 to aim the gas toward the support module 520.

The second module 540 may be moved in an X-axis direction by the second module driver 580. The second module driver 580 may move the second module 540 using a magnetic force. The second module driver 580 includes a first movement magnetic member 582, a second movement magnetic member 584, and a first controller 586. The first movement magnetic member 582 may be fixedly installed in the inclined plane 544b of the side plate 544. The second movement magnetic member 584 may be fixedly installed in the inclined plane 520b of the support module 520. Though not illustrated in detail, the first movement magnetic member 582 may include a magnetic body and a coil provided to a periphery of the magnetic body and may receive a current to change the polarity and intensity of the magnetic force of the magnetic body. The second movement magnetic member 584 may be a permanent magnet. The first controller 586 changes the intensity and direction of the current applied to the coil of the first movement magnetic member 582. Repulsive force or attractive force between the first movement magnetic member 582 and the second movement magnetic member 584 changes a position of the first movement magnetic member 582 relative to the second movement magnetic member 584, and thus the second module 540 may be moved along the support module 520. Since a technology for moving an object using magnetic force is widely used for an encoder motor and a magnetic levitation train, for example, detailed illustrations and descriptions thereof will be omitted.

Unlike the above-described embodiment, the first movement magnetic member 582 may be fixedly installed on the support module 520, and the second movement magnetic member 584 may be fixedly installed on the side plate 544. Also, the first movement magnetic member 582 and the second movement magnetic member 584 may be all electromagnets.

Since the second module 540 is moved by magnetic force while it is floated from the support module 520, particle generation due to contact between the second module 540 and the support module 520 may be prevented, and shaking of the second module 540 may be small when the second module 540 moves along the support module 520.

The first module driver 560 allows the first module 420 to be moved simultaneously with the second module 540. Also, the first module driver 560 corrects a position of the first module 420 with respect to the second module 540 to allow the first module 420 to be moved at a constant speed without shaking or rotation during a process. The first module driver 560 includes a first correction magnetic member 562, a second correction magnetic member 564, and a second controller 566. The first correction magnetic member 562 may be fixedly installed on an outer surface of the first module 420. Each first correction magnetic member 562 may be located between the first openings 424 of the first module 420. The second correction magnetic member 564 may be fixedly installed on an inner surface of the second module 540. Each second correction magnetic member 564 may be located on both sides of the second opening 542a of the second module 540. The second correction magnetic member 564 may be disposed to face the first correction magnetic member 562 provided on both sides of the mask 40 disposed on the process position. Though not shown, the first correction magnetic member 562 may include a magnetic body and a coil provided to a periphery of the magnetic body, and may receive a current to change the polarity and intensity of the magnetic force of the magnetic body.

The second correction magnetic member 564 may include a permanent magnet. The second controller 566 may control the intensity and direction of a current applied to the coil of the first correction magnetic member 562. The second controller 566 may determine the intensity and direction of a current applied to the coil of the first correction magnetic member 562 to allow the first module 420 to be move simultaneously with the second module 540 by an attractive force when the second module 540 may be moved in a straight line along an X-axis direction. A current may be applied to only the coil of the first correction magnetic member 562 located to face the second correction magnetic member 564 during a process.

Even when the second module 540 is moved relative to the support module 520 by magnetic force, small vibrations may be generated during movement of the second module 540.

Also, pressure of the gas supplied to float the second module 540 from the support module 520 or to float the first module 420 from the second module 540 may not be constant. For this reason, the first module 420 may experience small vibrations in various directions or may experience small, anomalous rotations of various angles as the first module 420 moves. To prevent the these vibrations and rotations from being generated to the mask 40 when the first module 420 moves during an exposure process, the intensity and direction of a current applied to the coil provided on the periphery of the magnetic body of each first correction magnetic member 562 may be controlled. That is, while the first module 420 moves in an X-axis direction and the exposure process is performed as described above, the intensity and direction of the current applied to each first correction magnetic member 562 are substantially constant as reference values, but continuously change within a small range to suppress the above-described fine vibrations and rotations. In other words, these applied currents are varied to compensate for the anomalous motions. Therefore, during the exposure process, the first module 420 approximately moves simultaneously with the second module 540, but a position of the first module 420 relative to the second module 540 continuously changes within a fine range.

Sensors 590 may be provided on the mask stage 400 to detect movement of the first module 420. The movement of the first module 420 includes a movement direction, a movement speed, and a rotation direction. The sensors 590 can detect a change of the movement of the first module 420 and transmit the detected signal to the second controller 566, for example. The sensors 590 may be disposed on the first module 420 or the second module 540. The sensors 590 may be adapted to detect the speed change or position change of an object using a change of magnetic force. The second controller 566 may control the intensity and direction of a current applied to the coil of each first correction magnetic member 562 on the basis of signals transmitted from the sensors 590.

The first module 420 may be moved while it does not contact the second module 540 during a process. A gas supply hole 840 for supplying a gas aimed at the first module 420 may be formed in a region of the inner surface of the second module 540 that is adjacent to the second opening 542a to float the first module 420 from the second module 540. The gas may include air, nitrogen, and any inert gas. The gas supply hole 840 may be formed in a slit shape or provided as a plurality of circular holes. The gas supply hole 840 may be provided to the second correction magnetic member 564.

To change a pattern, the mask 40 may be replaced when a region within the wafer 10 changes, the wafer itself changes, or the exposure process is performed on another wafer that belongs to another group. The replacement of the mask 40 may be performed by rotating the first module 420 around the central axis 428 of the first module 420 as described above.

The rotation unit 600 includes a first rotation magnetic member 620 and a second rotation magnetic member 640. The second rotation magnetic member 640 may be provided on an outer surface of the first module 420, and the first rotation magnetic member 620 may be provided on an inner surface of the second module 520. The second rotation magnetic member 640 may be provided in a ring shape to surround the central axis 428 of the second module. The first rotation magnet member 620 may include a magnetic body and a coil provided to a periphery of the magnetic body to receive a current. The second rotation magnetic member 640 may include a permanent magnet or an electromagnet. The first rotation magnetic member 620 and the second rotation magnetic member 640 are arranged to face each other. The rotational angle and movement direction of the first module 420 may be determined by the intensity and direction of a current applied to the coil of the first rotation magnetic member 620. The intensity and direction of the current applied to the coil of the first rotation magnetic member 620 may be controlled by a third controller 760. Unlike the above description, the first rotation magnetic member 620 may be provided to the second module 540, and the second rotation magnetic member 640 may be provide to the first module 420.

During the replacement of the mask 40 used for a process, the first module 420 should be rotated by an angle to a high accuracy. A rotation detection member 700 may measure a rotation angle of the mask 40 to detect whether rotation of the mask 40 has been properly performed.

Figure 6:
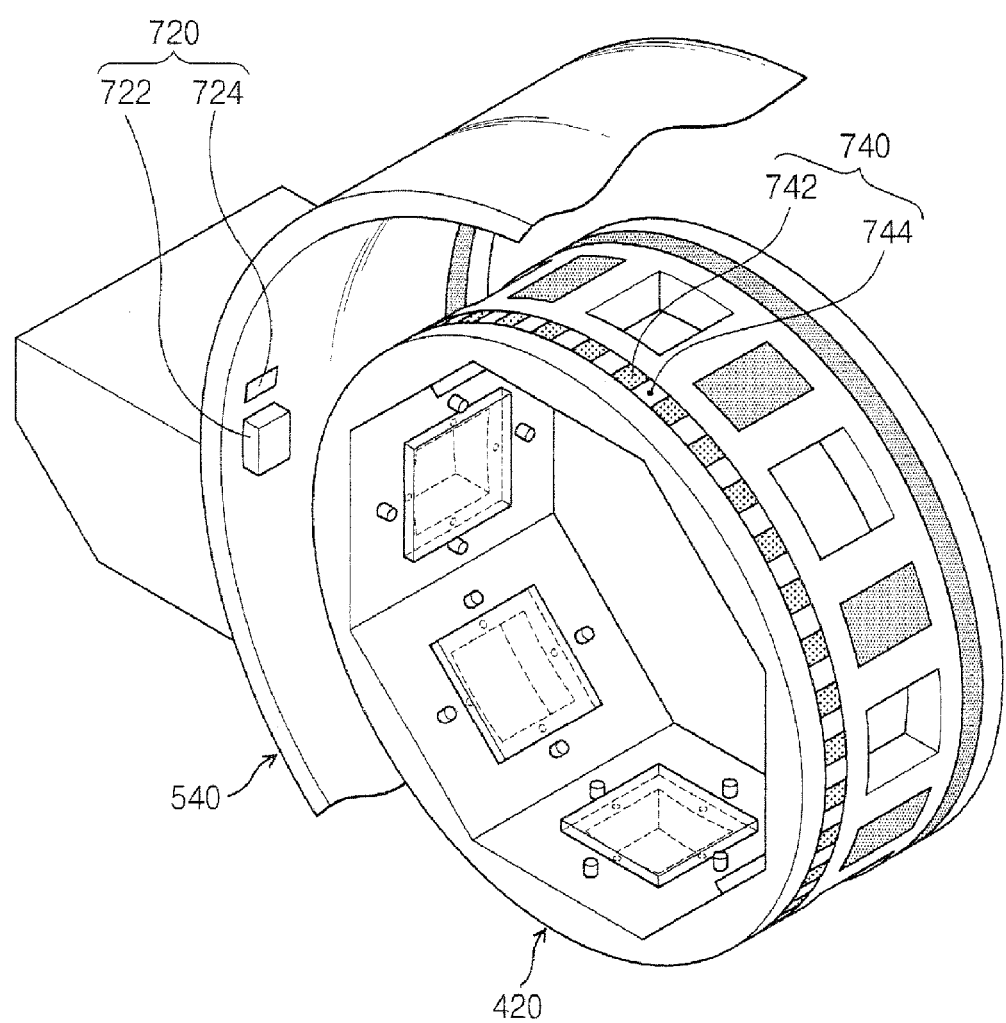
FIG. 6 is a schematic view illustrating a structure of a rotation unit in the exposure apparatus of FIG. 1.

FIG. 6 illustrates an embodiment of the rotation detection member 700. The rotation detection member 700 may include a sensor part 720 and a scale part 740. The scale part 740 may be located in a ring shape on an inner surface of the first module 420, and include rulers 742 provided in at equal intervals. The scale part 740 may include a standard mark 744. The sensor part 720 may include a counting sensor 722 and a standard sensor 724 fixedly installed on the second module 540. The counting sensor 722 may count the number of rulers 742 passing the counting sensor 722 during rotation of the first module 420. The standard sensor 724 may detect a standard mark 744 to determine an initial position of the first module 420. Each of the counting sensor 722 and the standard sensor 724 may function by using a light signal or a change of a magnetic flux. A signal detected by the counting sensor 722 and the standard sensor 724 may be transmitted to the third controller 760, which may control the intensity and direction of a current applied to the first rotation magnetic member 620 on the basis of the signal transmitted from the counting sensor 722 and standard sensor 724.

Next, a method of performing an exposure process using the above-described exposure apparatus 1 will now be described.

Masks 40, which may have different patterns, are loaded onto support surfaces 422 of the first module 420. Each of the masks 40 may be fixed on the support surfaces 422 of the first module 420 by a vacuum. The first module 420 may be rotated so that each of the first masks 40 is positioned in a process position that faces a second opening 542a of the second module 540. A wafer 10 may be placed on the substrate stage 100. The substrate stage 100 may be moved so that a first region of a plurality of regions within the wafer 10 is positioned on a predetermined region. When light is illuminated onto the first mask 40, the wafer 10 and the first mask 40 may be moved to opposite directions along a straight line, respectively. A pattern may then be formed in the first mask 40 to be transferred to the first region within the wafer 10. After that, the wafer 10 may be moved so that a second region of the plurality of regions within the wafer 10 is positioned where an exposure is performed, and the first mask 40 may be moved to its initial position. Subsequently, with light still illuminating the first mask 40, the wafer 10 and the first mask 40 may again be moved to opposite directions along a straight line, respectively, so that a pattern formed in the first mask 40 is transferred to the second region within the wafer 10. This process may be repeated to illuminate and process the remaining regions.

To change a pattern to be transferred onto the wafer 10, the first module 420 may be rotated so that a second mask 40 is moved into a process position. The exposure process may be performed in the same way as described above. Replacement of the mask 40 may be performed while a process is performed on one of the wafers 10. Alternatively, the replacement of the mask 40 may be performed when the wafer 10 to be processed is replaced.

In the above embodiment, an example where the exposure process is performed using scanning has been described. That is, the wafer 10 and the mask 40 are moved while the exposure is performed on one of regions within the wafer 10. However, alternatively, the exposure process may be performed using a step and repeat operation. In this case, while the exposure is performed on one of the regions within the wafer 10, a pattern formed in the mask 40 may be transferred onto a region within the wafer 10 with the wafer 10 and the mask 40 fixed.

Figure 7:
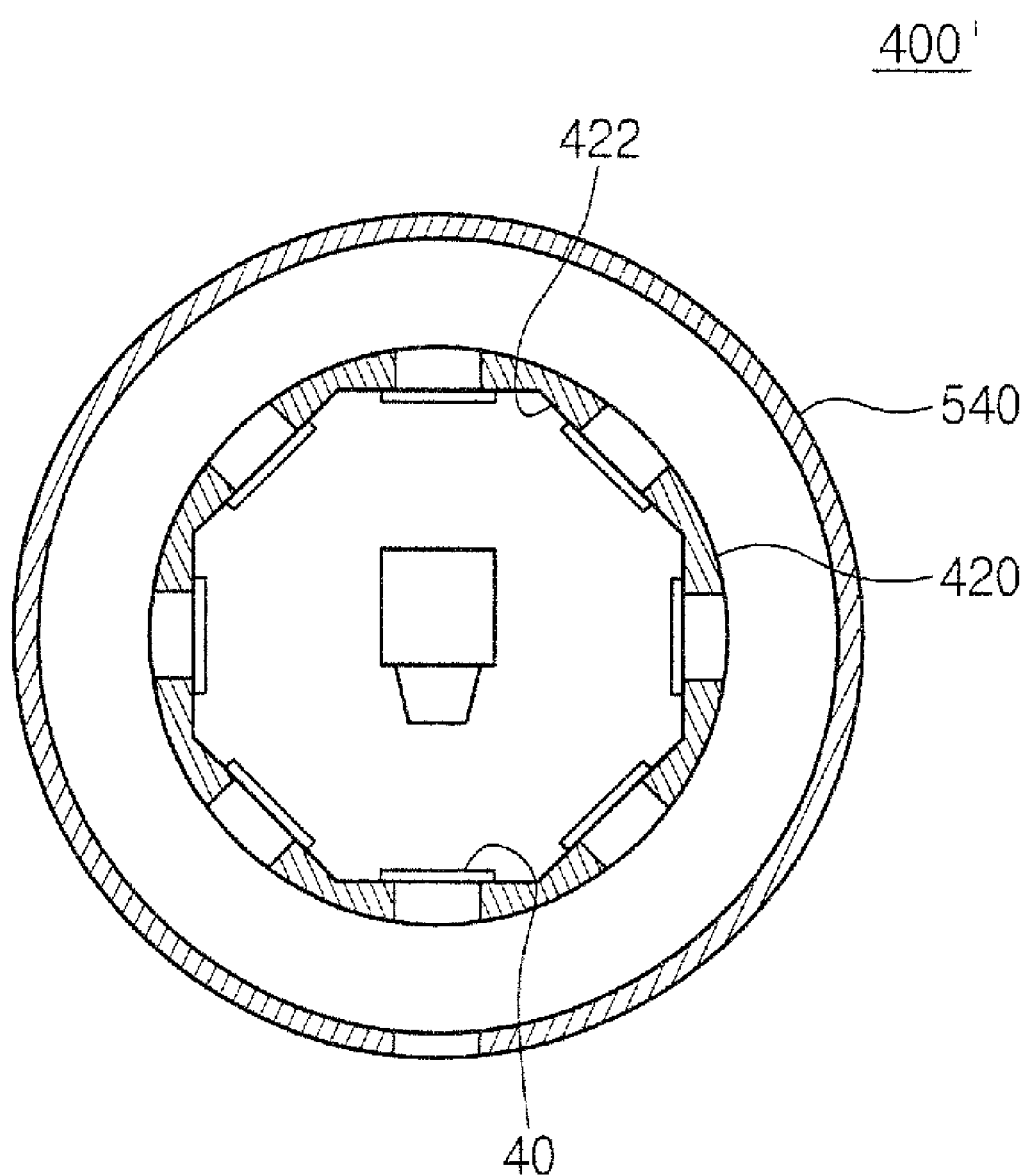
FIG. 7 is a cross-sectional view illustrating another embodiment of a substrate stage.

FIG. 7 illustrates an embodiment of a mask stage 400' used for an exposure apparatus 1 for an exposure process that may be performed using the step and repeat operation. The mask stage 400' may include a first module 420 having a plurality of support surfaces 422, and a mask replacing unit (not shown in the figure). The first module 420 has a substantially cylindrical shape as in the above-described embodiment, and has a plurality of support surfaces 422 formed on an inner surface of the first module 420. The mask replacing unit includes a rotation unit 600 (see FIG. 3, for example) for rotating the first module 420. A second module 540 disposed to surround the first module 420 may be provided to rotate a mask 40.

Referring to FIG. 6, the rotation unit 600 may include a first rotation magnetic member in the first module 420 and a second rotation magnetic member in the second module 540. Alternatively, the rotation unit 600 may rotate the first module 420 by a mechanical mechanism that uses a motor. In the present embodiment, since the exposure is performed on one region within the wafer 10 with the first module 420 fixed, a mask moving unit 500 does not need to be provided.

Figure 8:
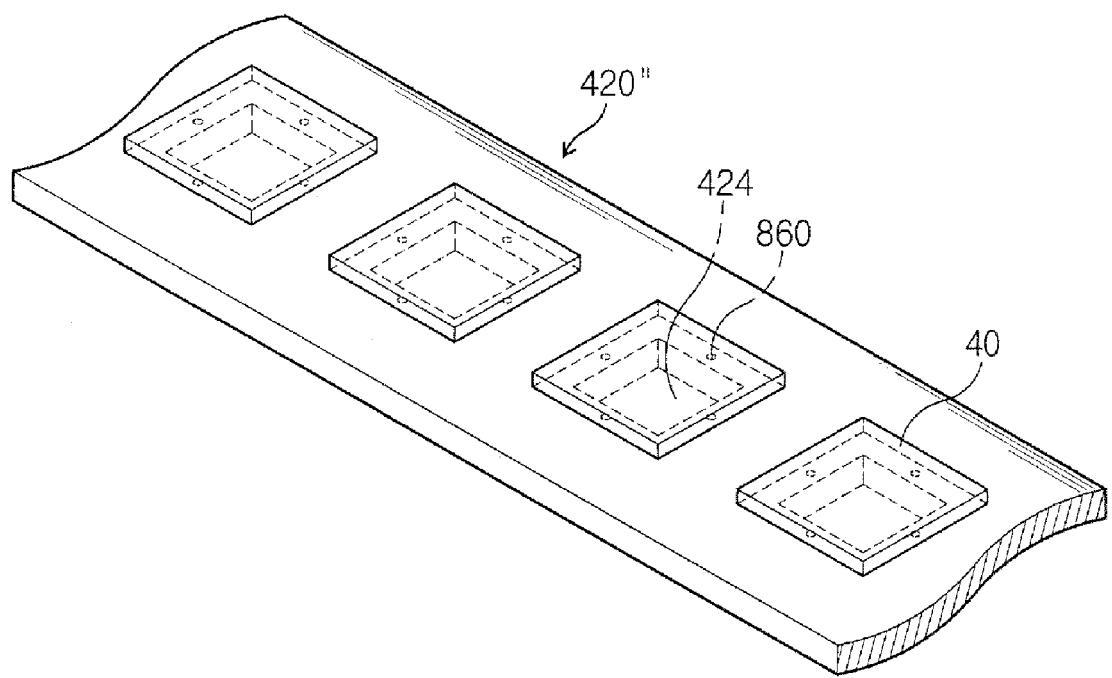
FIG. 8 is a perspective view illustrating still another embodiment of a substrate stage.

Also, in the above embodiment, the first module 420 may be provided in a cylindrical shape, and the replacement of the mask 40 may be preformed by rotation of the first module 420. However, alternatively, the first module 420 may be provided in a flat plate shape, and replacement of the mask 40 may be performed using a straight line motion of the first module 420 as in the mask stage 400" illustrated in FIG. 8. However, when the first module 420 is provided in a cylindrical shape as illustrated in FIG. 1, the area occupied by the first module 420 is generally reduced, and replacement of the mask 40 may also be simpler, which is preferred in comparison with the case where the first module 420 is provided in a flat plate shape.

Figure 9:
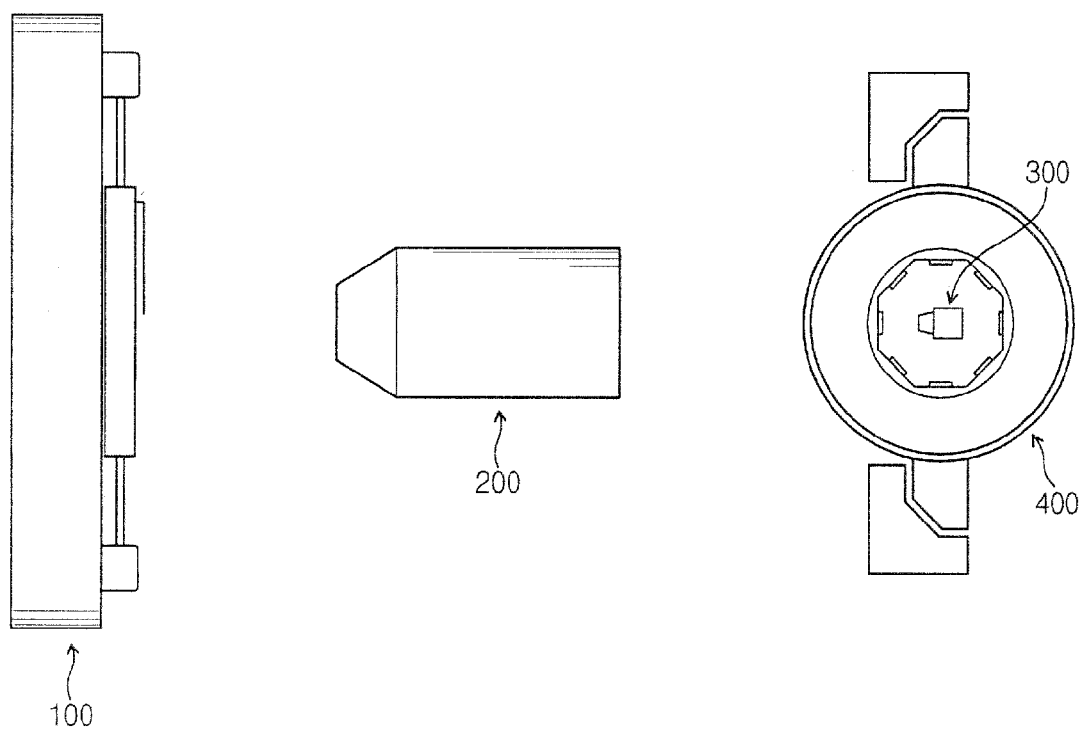
FIG. 9 is a front view illustrating another embodiment of an exposure apparatus.

Also, in the above embodiment, the substrate stage 100, the projection lens 200, and the mask stage 400 of the exposure apparatus I may be sequentially arranged in a vertical direction from down to up. However, alternatively, referring to FIG. 9, a substrate stage 100, a projection lens 200, and a mask stage 400 of an exposure apparatus 2 may be arranged side by side in a lateral direction. In this case, it is possible to minimize particles that may separate from the wafer 10, which may subsequently return to the surface of the wafer 10 to cause possible damage to the process.

According to some embodiments, since a plurality of masks are mounted on a mask stage, it is possible to reduce the time needed to replace the masks during a process.

Also, according to some embodiments, a first module for mounting a plurality of masks thereon may be provided in a cylindrical shape, and the replacement of the masks may be performed using rotation of the first module, so that a volume occupied by the mask stage may reduce and the replacement of the mask may be easily performed.

Also, according to some embodiments, since rotation or movement of the first module may be performed using magnetic force without mechanical contact, particle generation and vibration may be reduced compared with the case of a mechanical contact.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. An exposure apparatus comprising:
   a substrate stage to mount a substrate;

a mask stage to mount a plurality of masks, wherein the mask stage includes:
- a first module having a plurality of support surfaces, on each of which an individual mask is mounted;
- a mask replacing unit to change a position of the first module so that a mask to be used for a process among the masks mounted on the support surfaces is moved to the process position; and
- a mask moving unit to move the first module in a straight line during a process;

a light source member to illuminate light onto the mask that is positioned in the process position; and a projection lens to project light that has passed through the mask onto the substrate, wherein the first module has a cylindrical shape including an inside space, the support surfaces are provided on an inside surface of the first module and disposed about a circumference of the first module, and the mask replacing unit includes a rotation unit for rotating the first module, wherein the support surfaces are provided on the inside surface of the first module to surround a central axis of the first module, and first openings that pass through the first module are respectively formed in the support surfaces to provide a passage through which a pattern of the mask that is in the process position is transferred to the substrate, and wherein the mask moving unit comprises:
- a second module having a cylindrical-shaped body that includes a space for receiving the first module and has a second opening to provide a passage through which a pattern of a mask moved to the process position is transferred to the substrate;
- a support block to support the second module;
- a first module driver to change a position of the first module relative to the second module; and
- a second module driver to provide a driving force to move the second module along the support block.

2. The apparatus of claim 1, wherein a gas supply hole to supply a gas to float the second module from the support block is disposed in one of the support block and the second module.

3. The apparatus of claim 1, wherein the second module driver comprises:
- a first moving magnetic member coupled to the second module;
- a second moving magnetic member coupled to the support block; and
- a first controller for controlling a current applied to at least one of the first moving magnetic member and the second magnetic member so that the second module moves with respect to the support block using a magnetic force between the first moving magnetic member and the second moving magnetic member.

4. The apparatus of claim 3, wherein the first module driver comprises:
- a movement detecting sensor to detect movement of the first module;
- first correction magnetic members disposed between the first openings and fixedly installed in the first module;
- second correction magnetic members coupled to the second module to face the first correction magnetic members respectively located on both sides of the mask positioned in the process position; and
- a second controller to receive a signal detected by the movement detecting sensor, and to control a current applied to at least one of the first correction magnetic member and the second correction magnetic member so that the first module moves with the second module by magnetic force between the first correction magnetic member and the second correction magnetic member, and a position of the first module relative to the second module changes.

5. The apparatus of claim 4, wherein a gas supply hole to supply a gas to float the first module from the second module is disposed in one of the first module and the second module.

6. The apparatus of claim 1, wherein the substrate stage is located so that a substrate is fixed in its upright state during a process, and the projection lens and the mask stage are arranged side by side in a horizontal direction.

7. An exposure apparatus comprising:

a substrate stage to mount a substrate;

a mask stage to mount a plurality of masks, wherein the mask stage includes:
- a first module having a plurality of support surfaces, on each of which an individual mask is mounted;
- a mask replacing unit to change a position of the first module so that a mask to be used for a process among the masks mounted on the support surfaces is moved to the process position; and
- a second module having a cylindrical-shaped body that includes a space for receiving the first module and has a second opening to provide a passage through which a pattern of a mask moved to the process position is transferred to the substrate;

a light source member to illuminate light onto the mask that is positioned in the process position; and a projection lens to project light that has passed through the mask onto the substrate, wherein the first module has a cylindrical shape including an inside space, the support surfaces are provided on an inside surface of the first module and disposed about a circumference of the first module, and the mask replacing unit includes a rotation unit for rotating the first module, and wherein the rotation unit comprises:
- a first rotation magnetic member coupled to the first module;
- a second rotation magnetic member coupled to the second module; and wherein the exposure apparatus further comprises:
  - a third controller to control a current applied to at least one of the first rotation magnetic member and the second rotation magnetic member so that the first module rotates using a magnetic force between the first rotation magnetic member and the second rotation magnetic member.

8. The apparatus of claim 7, wherein the substrate stage is located so that a substrate is fixed in its upright state during a process, and the projection lens and the mask stage are arranged side by side in a horizontal direction.

9. An exposure apparatus comprising:

a substrate stage to mount a substrate;

a mask stage to mount a plurality of masks, wherein the mask stage includes:
- a first module having a plurality of support surfaces, on each of which an individual mask is mounted;
- a mask replacing unit to change a position of the first module so that a mask to be used for a process among the masks mounted on the support surfaces is moved to the process position; and
- a rotation sensing member to sense a rotation position of the first module;

a light source member to illuminate light onto the mask that is positioned in the process position; and a projection lens to project light that has passed through the mask onto the substrate, wherein the first module has a cylindrical shape including an inside space, the support surfaces are provided on an inside surface of the first module and disposed about a circumference of the first module, and the mask replacing unit includes a rotation unit for rotating the first module.

10. The apparatus of claim 9, wherein the mask stage further includes a second module having a cylindrical-shaped body that includes a space for receiving the first module and has a second opening to provide a passage through which a pattern of a mask moved to the process position is transferred to the substrate, and wherein the rotation sensing member comprises:
　a scale part disposed in a ring shape on one of the first module and the second module; and
　a sensor part disposed on the other of the first module and the second module to sense the scale of the scale part.

11. The apparatus of claim 9, wherein the substrate stage is located so that a substrate is fixed in its upright state during a process, and the projection lens and the mask stage are arranged side by side in a horizontal direction.

12. A mask stage to support masks having the same or different patterns, the mask stage comprising:
　a first module having a plurality of support surfaces to mount the masks;
　a mask replacing unit for moving the first module in a straight line or rotating the first module so that a mask to be used for a process among the masks supported by the support surfaces is moved to the process position; and
　a rotation sensing member for sensing a rotation position of the first module,
　wherein the first module has a cylindrical shape having an inside surface, and each of the support surfaces is disposed on a lateral surface of the inside surface of the first module, and
　wherein the mask replacing unit includes a rotation unit for rotating the first module.

13. A mask stage to support masks having the same or different patterns, the mask stage comprising:
　a first module having a plurality of support surfaces to mount the masks;
　a mask replacing unit for moving the first module in a straight line or rotating the first module so that a mask to be used for a process among the masks supported by the support surfaces is moved to the process position; and
　a mask moving unit for moving the first module in a straight line,
　wherein the first module has a cylindrical shape having an inside surface, and each of the support surfaces is disposed on a lateral surface of the inside surface of the first module, and
　wherein the mask moving unit comprises:
　　a second module having a cylindrical-shaped body that includes a space for receiving the first module and has a second opening providing a passage through which a pattern of the mask moved to the process position is transferred to the substrate;
　　a support block for supporting the second module;
　　a first module driver for moving the first module with the second module, and changing a position of the first module relative to the second module; and
　　a second module driver for providing a driving force to move the second module in a straight line along the support block.

14. The mask stage of claim 13, wherein a first gas supply opening for supplying a gas to float the second module from the support block is coupled to one of the support block and the second module, and a second gas supply opening for supplying a gas to float the first module from the second module is formed in one of the first module and the second module.

15. The mask stage of claim 13, wherein the second module driver comprises:
　a first moving magnetic member coupled to the second module;
　a second moving magnetic member coupled to the support block; and
　a first controller for controlling a current applied to at least one of the first moving magnetic member and the second magnetic member so that the second module moves in a straight line with respect to the support block using a magnetic force between the first moving magnetic member and the second moving magnetic member.

16. The mask stage of claim 13, wherein the first module driver comprises:
　a movement detecting sensor for detecting movement of the first module;
　first correction magnetic members disposed between the first openings and fixedly installed in the first module;
　second correction magnetic members fixedly installed in the second module to face the first correction magnetic members respectively located on both sides of the mask in the process position; and
　a second controller for receiving a signal detected by the movement detecting sensor, and for controlling a current applied to the first correction magnetic member and the second correction magnetic member so that the first module and the second module move using a magnetic force between the first correction magnetic member and the second correction magnetic member, and a position of the first module relative to the second module changes.

17. An exposure method comprising:
　mounting a plurality of masks onto a mask stage;
　positioning a selected mask into a process position of the mask stage;
　illuminating light onto the selected mask;
　transferring a pattern formed in the selected mask onto a substrate;
　replacing the selected mask with another mask by changing a position of the mask stage; and
　scanning by moving the mask in a straight line by a magnetic force,
　wherein the masks are arranged laterally along an inside surface of a first module provided in a cylindrical shape, and a position of the mask stage is changed by rotating the first module, and
　the first module is located in a space inside a cylindrical-shaped second module.

18. The method of claim 17, further comprising controlling a magnetic force to change the position of the mask stage.

19. The method of claim 17, further comprising:
　moving the second module in a straight line along a support block by a magnetic force;
　moving the first module and the second module by another magnetic force; and changing a position of the first module relative to the second module while the first module and the second module move simultaneously.

20. The method of claim 17, wherein the second module is floated from the support block by a gas, and the first module is floated from the second module by the gas.

21. The method of claim 17, wherein changing the position of the mask stage includes rotating the mask stage about a central axis of the mask stage.

22. An exposure apparatus comprising:
a substrate stage to mount a substrate;
a mask stage to mount a plurality of masks, wherein the mask stage includes:
a first module having a plurality of support surfaces, on each of which an individual mask is mounted, and having a cylindrical shape including an inside space, wherein the support surfaces are provided on an inside surface of the first module and disposed about a circumference of the first module, and wherein the support surfaces are provided on the inside surface of the first module to surround a central axis of the first module, and first openings that pass through the first module are respectively formed in the support surfaces to provide a passage through which a pattern of the mask that is in the process position is transferred to the substrate;
a mask moving unit to move the first module in a straight line during a process; and
a mask replacing unit to change a position of the first module so that a mask to be used for a process among the masks mounted on the support surfaces is moved to the process position, wherein the mask replacing unit includes a rotation unit for rotating the first module;
a light source member disposed within the inside space of the first module to illuminate light onto the mask that is positioned in the process position; and
a projection lens to project light that has passed through the mask onto the substrate, wherein the mask moving unit comprises:
a second module having a cylindrical-shaped body that includes a space for receiving the first module and has a second opening to provide a passage through which a pattern of a mask moved to the process position is transferred to the substrate;
a support block to support the second module;
a first module driver to change a position of the first module relative to the second module; and
a second module driver to provide a driving force to move the second module along the support block.

23. An exposure method comprising:
mounting a plurality of masks onto a first module provided in a mask stage, the first module having a cylindrical shape;
positioning a selected mask into a process position of the mask stage;
illuminating light onto the selected mask from an inside space of the first module;
transferring a pattern formed in the selected mask onto a substrate;
replacing the selected mask with another mask by changing a position of the mask stage; and
controlling a magnetic force to change the position of the mask stage.

24. An exposure method comprising:
mounting a plurality of masks onto a first module provided in a mask stage, the first module having a cylindrical shape, wherein the masks are arranged laterally along an inside surface of the first module, and a position of the mask stage is changed by rotating the first module;
positioning a selected mask into a process position of the mask stage;
illuminating light onto the selected mask from an inside space of the first module;
transferring a pattern formed in the selected mask onto a substrate;
replacing the selected mask with another mask by changing a position of the mask stage; and
scanning by moving the mask in a straight line by a magnetic force.

25. The method of claim 24, wherein the first module is located in a space inside a cylindrical-shaped second module.

* * * * *

UNITED STATES PATENT AND TRADEMARK OFFICE
CERTIFICATE OF CORRECTION

| | |
|---|---|
| PATENT NO. | : 7,525,645 B2 |
| APPLICATION NO. | : 11/426886 |
| DATED | : April 28, 2009 |
| INVENTOR(S) | : Sung-Soo Heo |

Page 1 of 1

It is certified that error appears in the above-identified patent and that said Letters Patent is hereby corrected as shown below:

Column 10, line 23, the word "preformed" should read --performed--;
Column 10, line 36, the words "apparatus I" should read --apparatus 1--.

Signed and Sealed this

Thirteenth Day of July, 2010

David J. Kappos
*Director of the United States Patent and Trademark Office*